(12) United States Patent
Shih et al.

(10) Patent No.: US 11,289,568 B2
(45) Date of Patent: Mar. 29, 2022

(54) REDUCTION OF ELECTRIC FIELD ENHANCED MOISTURE PENETRATION BY METAL SHIELDING

(71) Applicant: Taiwan Semiconductor Manufacturing Co., Ltd., Hsin-Chu (TW)

(72) Inventors: Chi-Yuan Shih, Hsinchu (TW); Kai-Fung Chang, Taipei (TW); Shih-Fen Huang, Jhubei (TW); Wen-Chuan Tai, Hsinchu (TW); Yi-Chuan Teng, Zhubei (TW); Yi Heng Tsai, Hsinchu (TW); You-Ru Lin, New Taipei (TW); Yen-Wen Chen, Hsinchu County (TW); Anderson Lin, Hsin-Chu (TW); Fu-Chun Huang, Zhubei (TW); Chun-Ren Cheng, Hsin-Chu (TW); Ivan Hua-Shu Wu, Hsinchu County (TW); Fan Hu, Taipei (TW); Ching-Hui Lin, Taichung (TW); Yan-Jie Liao, Hsin-Chu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 151 days.

(21) Appl. No.: 16/410,259

(22) Filed: May 13, 2019

(65) Prior Publication Data
US 2020/0006469 A1 Jan. 2, 2020

Related U.S. Application Data

(60) Provisional application No. 62/692,171, filed on Jun. 29, 2018.

(51) Int. Cl.
*H01L 49/02* (2006.01)
*H01L 23/58* (2006.01)
*H01L 23/00* (2006.01)

(52) U.S. Cl.
CPC ............ *H01L 28/60* (2013.01); *H01L 23/564* (2013.01); *H01L 23/585* (2013.01)

(58) Field of Classification Search
CPC ..... H01L 28/60; H01L 23/585; H01L 23/642; H01L 23/5223; H01L 28/40–92; H01L 23/564; H05K 1/162
See application file for complete search history.

(56) References Cited

U.S. PATENT DOCUMENTS

| 6,249,014 B1* | 6/2001 | Bailey | H01L 27/11502 257/295 |
| 2003/0094643 A1* | 5/2003 | Yang | H01L 28/60 257/296 |

OTHER PUBLICATIONS

Vemulapalli, et al. "Why Does a Stream of Water Deflect in an Electric Field?." Journal of Chemical Education, vol. 73 No. 9 Sep. 1996.

* cited by examiner

*Primary Examiner* — Hoang-Quan Ho
(74) *Attorney, Agent, or Firm* — Eschweiler & Potashnik, LLC (57) ABSTRACT

The present disclosure relates to a MIM (metal-insulator-metal) capacitor having a top electrode overlying a substrate. A passivation layer overlies the top electrode. The passivation layer has a step region that continuously contacts and extends from a top surface of the top electrode to sidewalls of the top electrode. A metal frame overlies the passivation layer. The metal frame continuously contacts and extends from a top surface of the passivation layer to upper sidewalls of the passivation layer in the step region. The metal frame (Continued)

has a protrusion that extends through the passivation layer and contacts the top surface of the top electrode.

20 Claims, 6 Drawing Sheets

REDUCTION OF ELECTRIC FIELD ENHANCED MOISTURE PENETRATION BY METAL SHIELDING

REFERENCE TO RELATED APPLICATION

This Application claims the benefit of U.S. Provisional Application No. 62/692,171, filed on Jun. 29, 2018, the contents of which are hereby incorporated by reference in their entirety.

BACKGROUND

Modern day integrated chips comprise millions or billions of transistor devices, which are configured to enable logical functionality for an integrated chip (e.g., form a processor configured to perform logic functions). Often integrated chips may also comprise passive devices, such as capacitors, resistors, inductors, varactors, etc. Metal-insulator-metal (MIM) capacitors are a common type of passive device that is often integrated into the back-end-of-the-line metal interconnect layers of integrated chips. For example, MIM capacitors may be used as decoupling capacitors configured to mitigate power supply or switching noise (e.g., switching of input/output (I/O) and core circuits) caused by changes in current flowing through various parasitic inductances associated with an integrated chip and a package in which the integrated chip is located.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are often implemented into the back-end-of-the-line (BEOL) metal interconnect layers of integrated chips. MIM capacitors typically have a top metal plate and a bottom metal plate separated by a capacitor dielectric layer. A passivation layer is disposed over the MIM capacitor with a metal protection frame disposed atop the passivation layer to provide protection for the MIM capacitor from the operational environment. However, when such an integrated chip is introduced to a wet, damp, or humid environment, water molecules are driven through the passivation layer to the top metal plate due to a potential difference between the metal protection frame and the top metal plate. The water molecules will cause a decrease in the voltage break down value of the MIM capacitor.

The present disclosure, in some embodiments, relates to a MIM capacitor including a top metal plate and a bottom metal plate separated by a capacitor dielectric layer, a passivation layer disposed over the top metal plate, and a metal protection frame disposed over the passivation layer. The passivation layer includes sidewalls that define an opening above a top surface of the top metal plate. The metal protection frame contacts the top surface of the top metal plate through the opening in the passivation layer. The contact of the metal protection frame and the top metal plate result in an equal potential difference between the metal protection frame and the top metal plate. The equal potential difference prevents water molecules from penetrating through the passivation layer to the top metal plate. There is no electrical gradient in the wet, damp, or humid environment between the top metal plate and the metal protection frame. This prevents the decrease in the voltage break down value.

Figure 1:
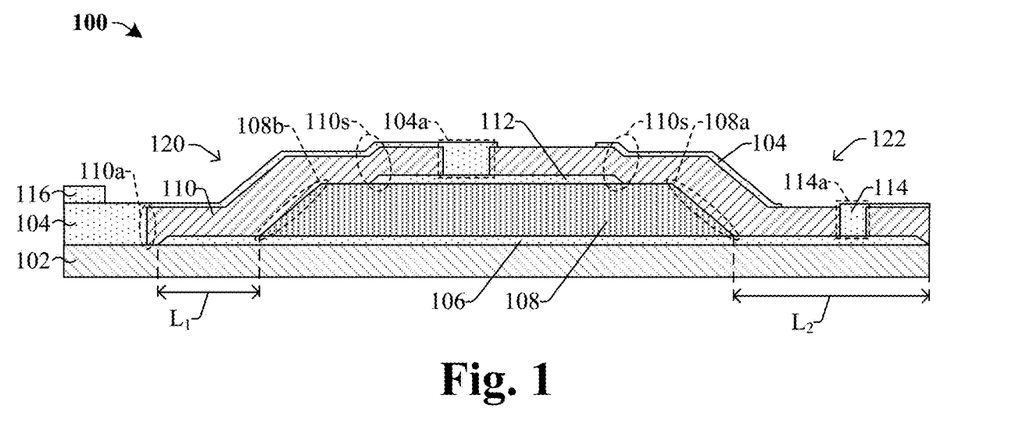
FIGS. 1-2 illustrate cross-sectional views of some embodiments of a metal-insulator-metal (MIM) capacitor having a passivation layer and metal frame in accordance with some embodiments.

FIG. 1 illustrates a cross-sectional view of some embodiments of a metal-insulator-metal (MIM) capacitor 100 including a bottom electrode 106 disposed over a substrate 102. A dielectric layer 108 having sloped sidewalls is disposed over the bottom electrode 106. A top electrode 112 is disposed over the dielectric layer 108. A passivation layer 110 is disposed over the bottom electrode 106, dielectric layer 108, and top electrode 112. The passivation layer 110 contacts a top surface of the top electrode 112, sidewalls of the top electrode 112, sidewalls of the dielectric layer 108, and sidewalls of the bottom electrode 106. A metal frame 104 overlies the passivation layer 110. The metal frame 104 has a protrusion 104a that extends through the passivation layer 110 to the top surface of the top electrode 112. The protrusion 104a of the metal frame 104 directly contacts the top surface of the top electrode 112. The metal frame 104 extends continuously over a top surface of the passivation layer 110, sidewalls of the top electrode 112, and sidewalls of the dielectric layer 108.

On a first side 120 of the MIM capacitor 100 the metal frame 104 continuously extends from the top surface of the passivation layer 110 to a sidewall 110a of the passivation layer 110. On the first side 120 of the MIM capacitor 100 a first electrical lead 116 overlies the metal frame 104. On a second side 122 of the MIM capacitor 100 the metal frame 104 extends continuously from the top surface of the passivation layer 110 past a sidewall 108a of the dielectric layer 108. On the second side 122 of the MIM capacitor 100 a second electrical lead 114 overlies the passivation layer 110. The second electrical lead 114 has a protrusion 114a that extends through the passivation layer 110 to the bottom electrode 106. The second electrical lead 114 is laterally offset the metal frame 104 by a non-zero distance.

The dielectric layer 108 has sidewalls 108a, 108b which are disposed laterally between sidewalls of the bottom electrode 106 in a top view. Sidewalls of the top electrode 112 are disposed laterally between the sidewalls 108a, 108b of the dielectric layer 108 in a top view. The protrusion 104a of the metal frame 104 is disposed laterally between the sidewalls of the top electrode 112. The second electrical lead 114 is electrically coupled to the bottom electrode 106. On the first side 120 of the MIM capacitor 100 the bottom electrode 106 laterally extends a first length $L_1$ from the sidewall 108b of the dielectric layer 108. On the second side 122 of the MIM capacitor 100 the bottom electrode 106 laterally extends a second length $L_2$ from the sidewall 108a of the dielectric layer 108. In some embodiments, the second length $L_2$ is greater than the first length $L_1$.

The metal frame 104 is electrically coupled to the top electrode 112 and facilitates an equal electric potential between the metal frame 104 and the top electrode 112. When the MIM capacitor 100 is introduced to a wet, damp, or humid environment there is no electrical gradient between the top electrode 112 and the metal frame 104. The metal frame 104 blocks water molecules from penetrating the passivation layer 110 and reaching the top electrode 112 because there is an equal electric potential between the metal frame 104 and the top electrode 112. This will prevent the MIM capacitor 100 from reducing the breakdown voltage in a wet, damp, or humid environment.

For example, if the metal frame 104 were not present, a large electric field would be present at the outer edge of the top electrode 112, due to the tendency of electrons to congregate near edges/corners on outer surfaces of conductive bodies. Even though the passivation layer 110 covers the outer edge of the top electrode 112, if the metal frame 104 were not in place, the passivation layer 110 would be susceptible to water molecules (or other molecules) being driven through a step region 110s of the passivation layer 110 due to the large electric field in the step region 110s. Therefore, in some embodiments according to the present disclosure, the metal frame 104 covers the step region 110s to provide another physical barrier and to limit the electrical gradient encountered by polar molecules in the step region 110s, such that the metal frame 104 enhances the breakdown voltage of the MIM capacitor 100.

Figure 2:
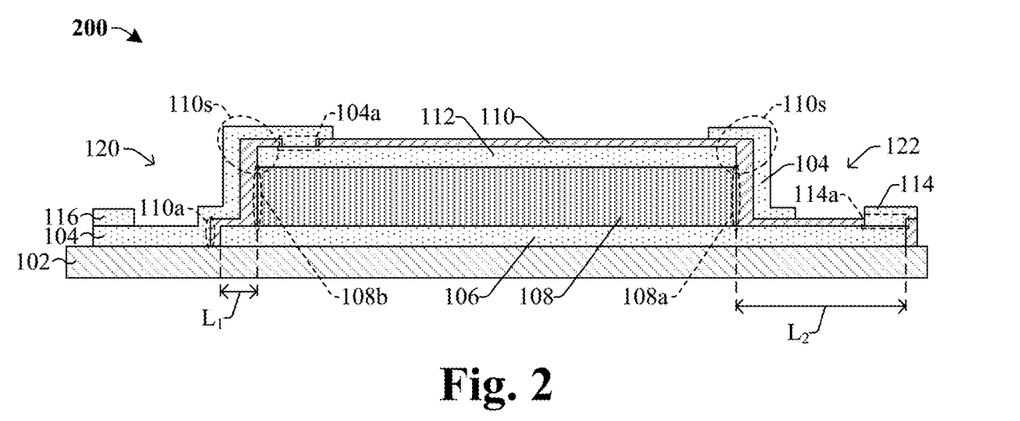

FIG. 2 illustrates a cross-sectional view of some embodiments of a MIM capacitor 200 including a bottom electrode 106 overlying a substrate 102. A dielectric layer 108 is disposed over the bottom electrode 106. A top electrode 112 is disposed over the dielectric layer 108. A passivation layer 110 is disposed over the bottom electrode 106, dielectric layer 108, and top electrode 112. The passivation layer 110 contacts a top surface of the top electrode 112, sidewalls of the top electrode 112, dielectric layer sidewalls 108a, 108b, and sidewalls of the bottom electrode 106. A metal frame 104 is disposed over the passivation layer 110. A protrusion 104a of the metal frame 104 extends through the passivation layer 110 to the top electrode 112. The metal frame 104 extends continuously over a top surface of the passivation layer 110, sidewalls of the top electrode 112, and sidewalls of the dielectric layer 108. In some embodiments, the dielectric layer sidewalls 108a, 108b are substantially straight and parallel to one another. In further embodiments, a sidewall 110a of the passivation layer 110 is substantially straight and forms a 90 degree angle with a line parallel to a top surface of the substrate 102. The metal frame 104 covers the step region 110s of the passivation layer 110 to provide another physical barrier and to limit the electrical gradient encountered by polar molecules in the step region 110s as illustrated and/or described in FIG. 1.

On a first side 120 of the MIM capacitor 200 the metal frame 104 continuously extends from the top surface of the passivation layer 110 to a sidewall 110a of the passivation layer 110. On the first side 120 of the MIM capacitor 200 a first electrical lead 116 is disposed over a top surface of the metal frame 104. On a second side 122 of the MIM capacitor 200 the metal frame 104 extends continuously from the top surface of the passivation layer 110 past the sidewall 108a of the dielectric layer 108 and continues over the top surface of the bottom electrode 106. On the second side 122 of the MIM capacitor 200 a second electrical lead 114 is disposed over the bottom electrode 106 and the passivation layer 110. The second electrical lead 114 has a protrusion 114a that extends through the passivation layer 110 to the bottom electrode 106.

The dielectric layer sidewalls 108a, 108b are disposed laterally between sidewalls of the bottom electrode 106 in a top view. Sidewalls of the top electrode 112 are aligned with the dielectric layer sidewalls 108a, 108b. The protrusion 104a of the metal frame 104 is disposed laterally between sidewalls of the top electrode 112 in a top view. The second electrical lead 114 is electrically coupled to the bottom electrode 106. On the first side 120 of the MIM capacitor 200 the bottom electrode 106 extends a first length $L_1$ from the sidewall 108b of the dielectric layer 108. On the second side 122 of the MIM capacitor 200 the bottom electrode 106 extends a second length $L_2$ from the sidewall 108a of the dielectric layer 108. In some embodiments, the second length $L_2$ may be greater than the first length $L_1$, such that the second electrical lead 114 may be disposed over the bottom electrode 106 on the second side 122.

In some embodiments, the protrusion 104a of the metal frame 104 may have a width within the range of 10 μm to 50 μm, 50 μm to 100 μm, 100 μm to 500 μm, 500 μm to 10 mm, or 10 mm to 100 mm. In some embodiments, the thickness of the passivation layer 110 is within a range of 10 Angstroms to 100 Angstroms, 100 Angstroms to 1000 Angstroms, 0.1 μm to 1 μm, 1 μm to 100 μm, or 100 μm to 1 mm. In some embodiments, a thickness of the top electrode 112 is within a range of 10 Angstroms to 100 Angstroms, 100 Angstroms to 1000 Angstroms, 0.1 µm to 1 µm, 1 µm to 100 µm, or 100 µm to 1 mm. In some embodiments, a thickness of the bottom electrode 106 is within a range of 10 Angstroms to 100 Angstroms, 100 Angstroms to 1000 Angstroms, 0.1 µm to 1 µm, 1 µm to 100 µm, or 100 µm to 1 mm.

In some embodiments, the top electrode 112 is comprised of copper, galvanized iron, lead, nickel, nickel-chromium, zinc, aluminum, platinum, gold, ruthenium, copper alloy, graphite, calcium, cesium carbonate, lithium fluoride, molybdenum (VI) oxide, silver, carbon, palladium, tin, titanium, vanadium, chromium, manganese, cobalt, gallium, indium, scandium, mixed metal oxide, titanium nitride, tantalum nitride, thallium, doped silicon, poly silicon, germanium, antimony, tungsten, hafnium, iridium, alloys of these, combinations thereof, or the like.

In some embodiments, the bottom electrode 106 is comprised of copper, galvanized iron, lead, nickel, nickel-chromium, zinc, phosphor bronze, aluminum, platinum, gold, ruthenium, copper alloy, graphite, calcium, cesium carbonate, lithium fluoride, molybdenum (VI) oxide, silver, carbon, palladium, tin, titanium, vanadium, chromium, manganese, cobalt, gallium, indium, scandium, mixed metal oxide, titanium nitride, tantalum nitride, thallium, doped silicon, poly silicon, germanium, antimony, tungsten, hafnium, iridium, alloys of these, combinations thereof, or the like.

In some embodiments, the dielectric layer 108 is comprised of ceramic, metal oxide, aluminum nitride, lead zirconate titanate, carbide, silicon dioxide, nitride, or the like. In some embodiments, the passivation layer 110 may, for example, be or comprise silicon nitride (e.g. $Si_3N_4$), ceramic, metal oxide, carbide, silicon dioxide, nitride, or the like. In some embodiments, the metal frame 104 may, for example, be or comprise copper, galvanized iron, lead, nickel, nickel-chromium, zinc, aluminum, platinum, gold, ruthenium, copper alloy, graphite, calcium, cesium carbonate, lithium fluoride, molybdenum (VI) oxide, silver, carbon, palladium, tin, titanium, vanadium, chromium, manganese, cobalt, gallium, indium, scandium, mixed metal oxide, titanium nitride, tantalum nitride, thallium, doped silicon, poly silicon, germanium, antimony, tungsten, hafnium, iridium, alloys of these, combinations thereof, or the like. The substrate 102 may be, for example, a bulk substrate (e.g., a bulk silicon substrate) or a silicon-on-insulator (SOI) substrate.

Figure 3A:
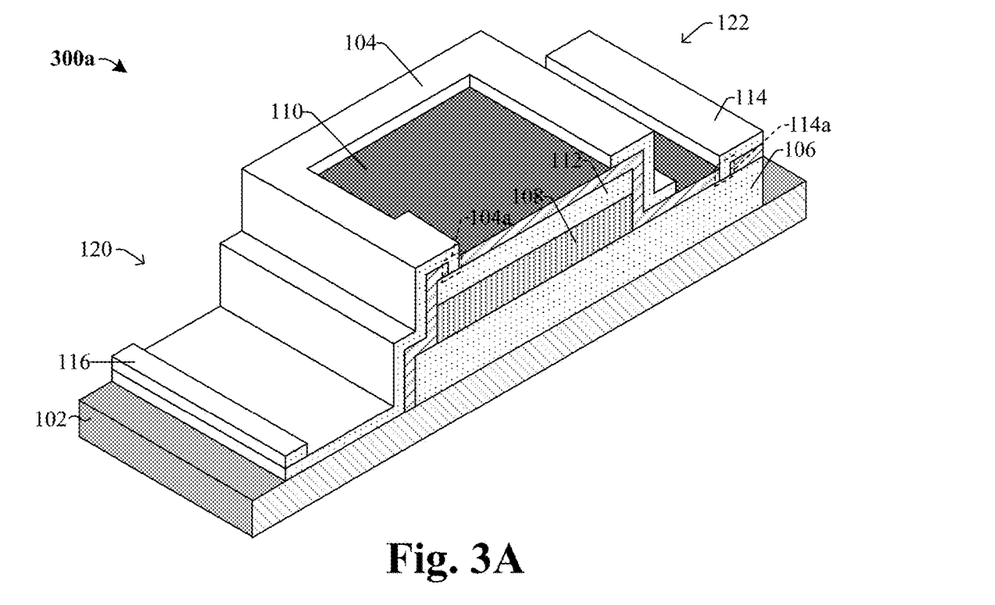
FIG. 3A illustrates a perspective view of some embodiments of a MIM capacitor having a passivation layer and a metal frame with a cross-sectional cut shown for some of the MIM capacitors, according to the present disclosure.

FIG. 3A illustrates a perspective view of some embodiments of a MIM capacitor 300a. The MIM capacitor 300a includes a substrate 102 below a bottom electrode 106. A dielectric layer 108 is disposed over the bottom electrode 106. A top electrode 112 is disposed over the dielectric layer 108. A passivation layer 110 is disposed over the top electrode 112. The passivation layer 110 contacts sidewalls of the top electrode 112, sidewalls of the dielectric layer 108, and some of the sidewalls of the bottom electrode 106. A metal frame 104 is disposed over the passivation layer 110. The metal frame 104 has a protrusion 104a that extends through the passivation layer 110 to the top surface of the top electrode 112. The metal frame 104 may not cover the entire upper surface of the passivation layer 110.

On a first side 120 of the MIM capacitor 300a the metal frame 104 continuously extends from the top surface of the top electrode 112 to a sidewall of the passivation layer 110 and continues over the substrate 102. On the first side 120 of the MIM capacitor 300a a first electrical lead 116 is disposed over a top surface of the metal frame 104. On a second side 122 of the MIM capacitor 300a the metal frame 104 extends continuously from the top surface of the passivation layer 110 past a sidewall of the dielectric layer 108 and continues over a top surface of the bottom electrode 106. On the second side 122 of the MIM capacitor 300a a second electrical lead 114 is disposed over the bottom electrode 106. The second electrical lead 114 has a protrusion 114a that extends through the passivation layer 110 and contacts the top surface of the bottom electrode 106.

Figure 3B:
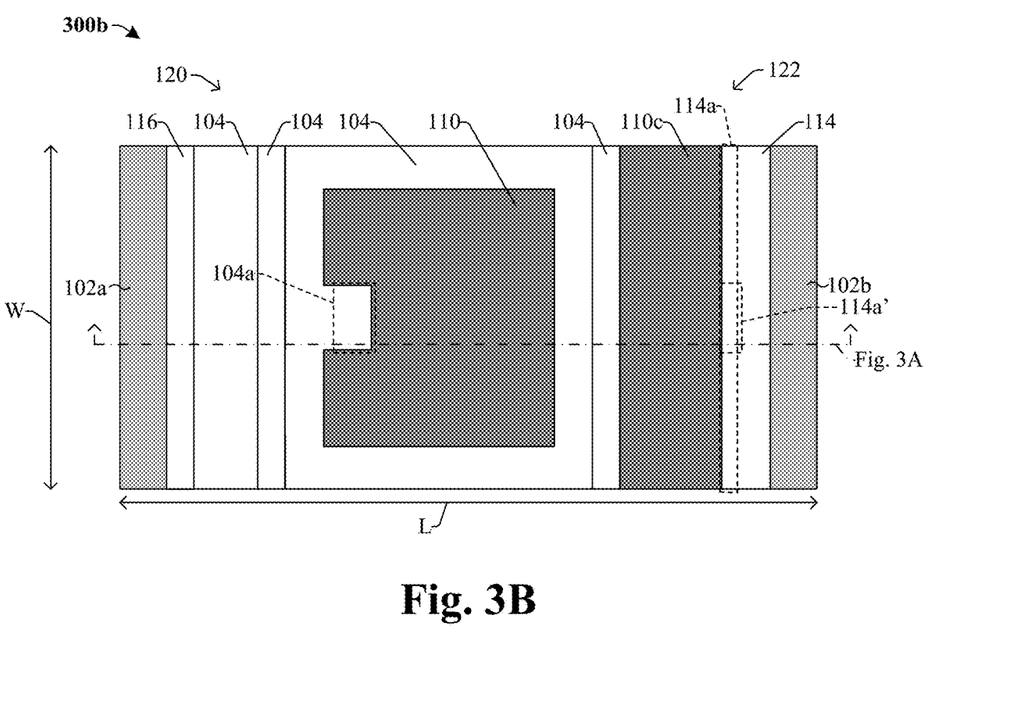
FIG. 3B illustrates a top view of some embodiments of a MIM capacitor having a passivation layer and a metal frame, according to the present disclosure.

FIG. 3B illustrates a top view of some additional embodiments of a MIM capacitor 300b. The MIM capacitor 300b has a length L and a width W. The MIM capacitor 300b includes a passivation layer 110 partially surrounded by a metal frame 104. A protrusion 104a of the metal frame 104 protrudes into the passivation layer 110. A portion 110c of the passivation layer 110 is disposed laterally outside of the metal frame 104. A first electrical lead 116 is disposed over the metal frame 104. A second electrical lead 114 is disposed laterally next to the portion 110c of the passivation layer 110. The portion 110c of the passivation layer 110 is between the second electrical lead 114 and the metal frame 104. A first section 102a of a substrate 102 is laterally disposed next to the first electrical lead 116 and a second section 102b of the substrate 102 is laterally disposed next to the second electrical lead 114. In some embodiments, the protrusion 114a of the second electrical lead 114 extends across the entire width W of the MIM capacitor 300b as illustrated by the dashed box labeled 114a in FIG. 3B. In further embodiments, a center of a protrusion 114a' of the electrical lead 114 is disposed at a widthwise center of the MIM capacitor 300b and does not extend across the entire width W of the MIM capacitor 300b, as illustrated by the other dashed box labeled 114a' in FIG. 3B.

Figure 4A:
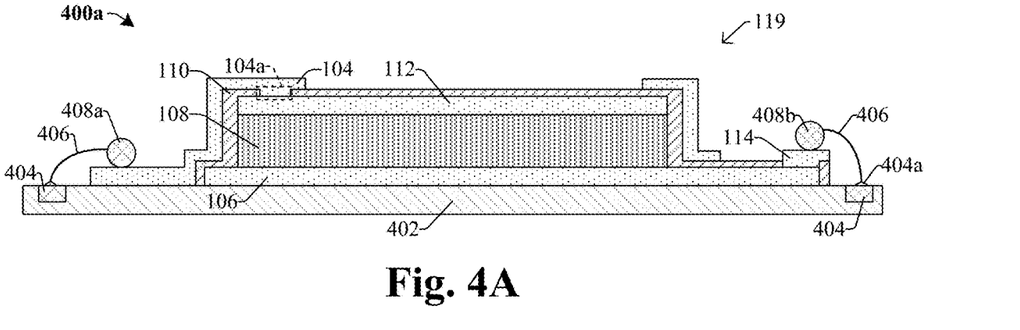
FIG. 4A illustrates a cross-sectional view of some embodiments of a MIM device including a MIM capacitor overlying a printed circuit board (PCB) substrate, according to the present disclosure.

FIG. 4A illustrates a cross-sectional view of some embodiments of a MIM device 400a. The MIM device 400a includes a printed circuit board (PCB) substrate 402 and a MIM capacitor 119. The MIM capacitor 119 includes a dielectric layer 108 disposed over a bottom electrode 106. A top electrode 112 is disposed over the dielectric layer 108. A passivation layer 110 is disposed over the top electrode 112. The passivation layer 110 contacts sidewalls of the top electrode 112, sidewalls of the dielectric layer 108, and sidewalls of the bottom electrode 106. A metal frame 104 is disposed over the passivation layer 110. The metal frame 104 has a protrusion 104a that extends through the passivation layer 110 and directly contacts the top surface of the top electrode 112. A second electrical lead 114 contacts the bottom electrode 106 through the passivation layer 110. A portion of the bottom surface of the second electrical lead 114 directly contacts a top surface of the bottom electrode 106 and another portion may contact the passivation layer 110 on the sidewall of the bottom electrode 106.

The PCB substrate 402 includes metal lines 404. The metal lines 404 have electrical connector pads 404a to provide a wire bonding location for the metal lines 404. A first solder ball 408a is disposed over the metal frame 104. A second solder ball 408b is disposed over the second electrical lead 114. The first solder ball 408a and the second solder ball 408b provide contact points for metal wires 406. In some embodiments, the metal wires 406 electrically contact the metal lines 404 through the connector pad 404a. In other embodiments, the metal wires 406 are electrically coupled to a different independent device (not shown).

Figure 4B:
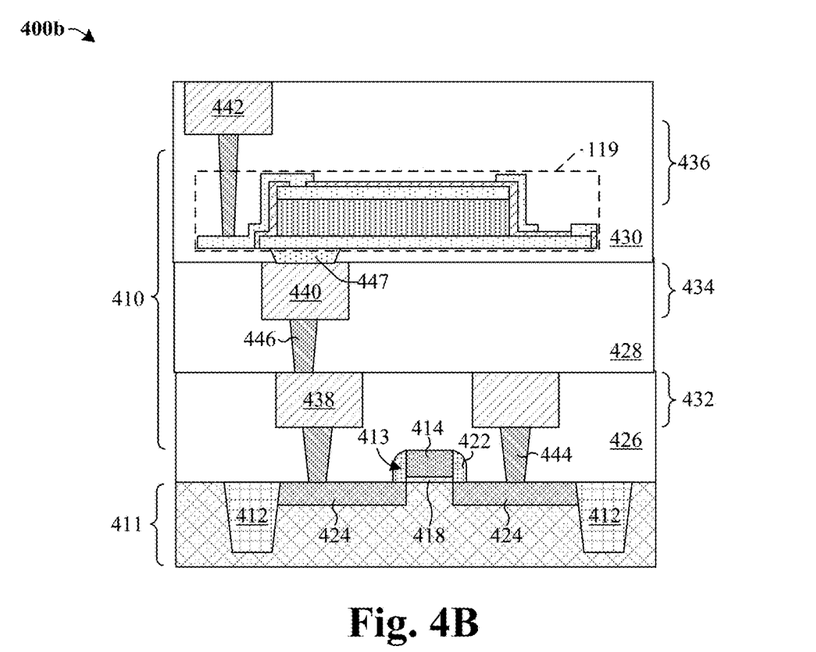
FIG. 4B illustrates a cross-sectional view of some embodiments of an integrated chip including a MIM capacitor overlying a substrate, according to the present disclosure.

Referring to FIG. 4B, a cross-sectional view of an integrated chip 400b in accordance with some embodiments is provided.

The integrated chip 400b includes a MIM capacitor 119 disposed in an interconnect structure 410 between neighboring metal layers of the integrated chip 400b. The integrated chip 400b includes a substrate 411. The substrate 411 may be, for example, a bulk substrate (e.g., a bulk silicon substrate) or a silicon-on-insulator (SOI) substrate. The illustrated embodiment depicts one or more shallow trench isolation (STI) regions 412, which may include a dielectric-filled trench within the substrate 411.

An access transistor 413 is disposed between the STI regions 412. The access transistor 413 includes access gate electrode 414; access gate dielectric 418; access sidewall spacers 422; and source/drain regions 424. The source/drain regions 424 are disposed within the substrate 411 between the access gate electrode 414 and the STI regions 412, and are doped to have a first conductivity type which is opposite a second conductivity type of a channel region under the gate dielectric 418. The access gate electrode 414 may be, for example, doped polysilicon, a silicide, or a metal, such as tungsten, titanium, or combinations thereof. The gate dielectric 418 may be, for example, an oxide, such as silicon dioxide, or a high-κ dielectric material. The access sidewall spacers 422 can be made of silicon nitride (e.g., $Si_3N_4$), for example.

The interconnect structure 410 is arranged over the substrate 411 and couples devices (e.g., access transistor 413 and MIM capacitor 119) to one another. The interconnect structure 410 includes a plurality of inter-metal dielectric (IMD) layers 426, 428, 430, and a plurality of metallization layers 432, 434, 436 which are layered over one another in alternating fashion. The IMD layers 426, 428, 430 may be made, for example, of a low K dielectric, such as un-doped silicate glass, or an oxide, such as silicon dioxide, or an extreme low K dielectric layer. The metallization layers 432, 434, 436 include metal lines 438, 440, 442, which are formed within trenches, and which may be made of a metal, such as copper or aluminum. Contacts 444 extend from the bottom metallization layer 432 to the source/drain regions 424 and/or gate electrode 414; and via 446 extend between the metallization layers 432, 434, 436. A via 447 extends between the MIM capacitor 119 and the metal line 440. The contacts 444 and the vias 446 may be made of a metal, such as copper or tungsten, for example.

FIGS. 5-10 illustrate cross-sectional views 500-1000 of some embodiments of a method of forming a MIM capacitor including a passivation layer and metal frame according to the present disclosure. Although the cross-sectional views 500-1000 shown in FIGS. 5-10 are described with reference to a method, it will be appreciated that the structures shown in FIGS. 5-10 are not limited to the method but rather may stand alone separate of the method. Although FIGS. 5-10 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
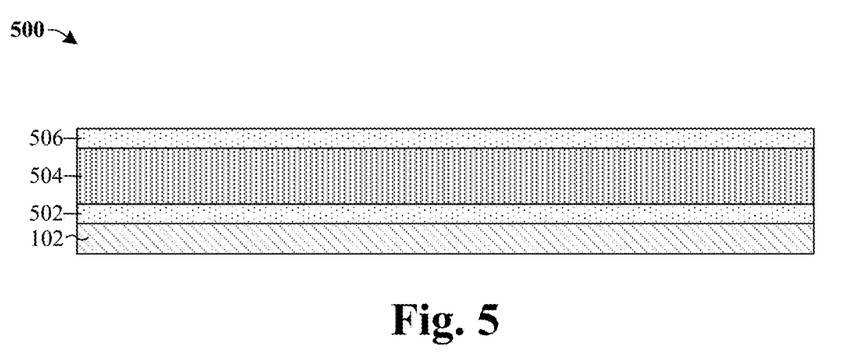
FIGS. 5-10 illustrate some cross-sectional views showing an example method of forming a MIM capacitor having a passivation layer and metal frame, according to the present disclosure.

As shown in cross-sectional view 500 of FIG. 5, a substrate 102 is provided. A bottom electrode layer 502 is formed over the substrate 102. A dielectric film 504 is formed over the bottom electrode layer 502. A top electrode layer 506 is formed over the dielectric film 504. In some embodiments, the bottom electrode layer 502 and/or the top electrode layer 506 may be deposited and/or grown by electroless plating, electroplating, or another suitable deposition process. In some embodiments, the dielectric film 504 may be deposited and/or grown by chemical vapor deposition (CVD), physical vapor deposition (PVD), atomic layer deposition (ALD), thermal oxidation, or another suitable deposition process.

In some embodiments, the bottom electrode layer 502 and/or the top electrode layer 506 is comprised of copper, galvanized iron, lead, nickel, nickel-chromium, zinc, aluminum, platinum, gold, ruthenium, copper alloy, graphite, calcium, cesium carbonate, lithium fluoride, molybdenum (VI) oxide, silver, carbon, palladium, tin, titanium, vanadium, chromium, manganese, cobalt, gallium, indium, scandium, mixed metal oxide, titanium nitride, tantalum nitride, thallium, doped silicon, poly silicon, germanium, antimony, tungsten, hafnium, iridium, alloys of these, combinations thereof, or the like.

Figure 6:
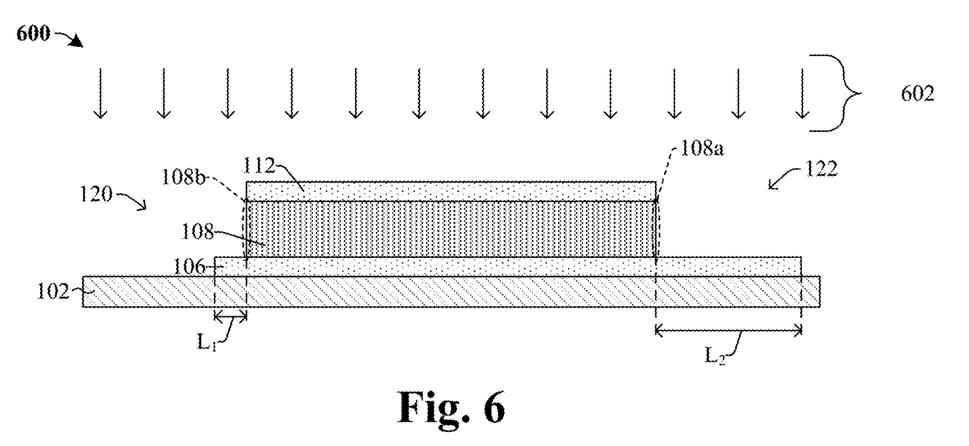

As shown in cross-sectional view 600 of FIG. 6, a removal process is performed to remove portions of the bottom electrode layer (502 of FIG. 5), the dielectric film (504 of FIG. 5), and the top electrode layer (506 of FIG. 5) defining the bottom electrode 106, dielectric layer 108, and the top electrode 112, respectively. In some embodiments, the removal process may be performed by forming a masking layer (not shown) over the top electrode layer (506 of FIG. 5) and subsequently exposing unmasked areas of the top electrode layer (506 of FIG. 5) to one or more etchants 602. In some embodiments, the removal process includes multiple etching processes with different patterns to form these features having different areas.

On a first side 120 the bottom electrode 106 laterally extends a first length $L_1$ from a sidewall 108b of the dielectric layer 108. On a second side 122 the bottom electrode 106 laterally extends a second length $L_2$ from the sidewall 108a of the dielectric layer 108. In some embodiments, the second length $L_2$ is greater than the first length $L_1$, such that the bottom electrode 106 has sufficient space on the second side 122 to form an electrical contact over a top surface of the bottom electrode 106 that is laterally offset an overlying metal frame by a non-zero distance (e.g., see FIG. 10).

Figure 7:
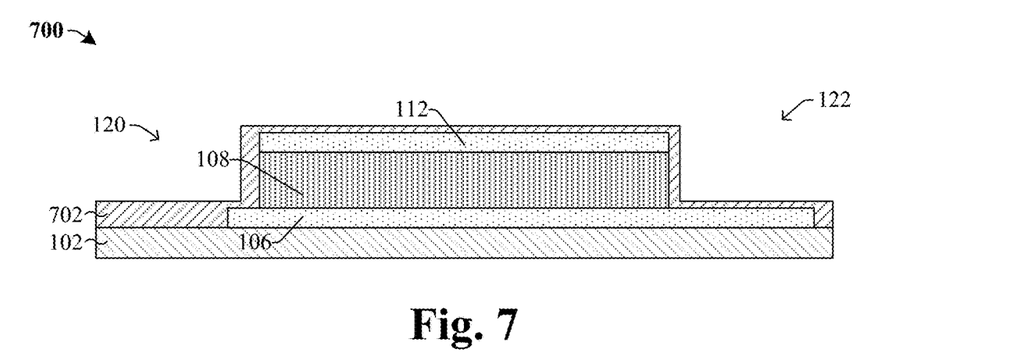

As shown in cross-sectional view 700 of FIG. 7, a passivation film 702 is deposited over an upper surface of the top electrode 112, the bottom electrode 106, and the substrate 102. The passivation film 702 can be deposited, for example, by PVD, CVD, plasma-enhanced chemical vapor deposition (PECVD), ALD, or another suitable deposition process.

Figure 8:
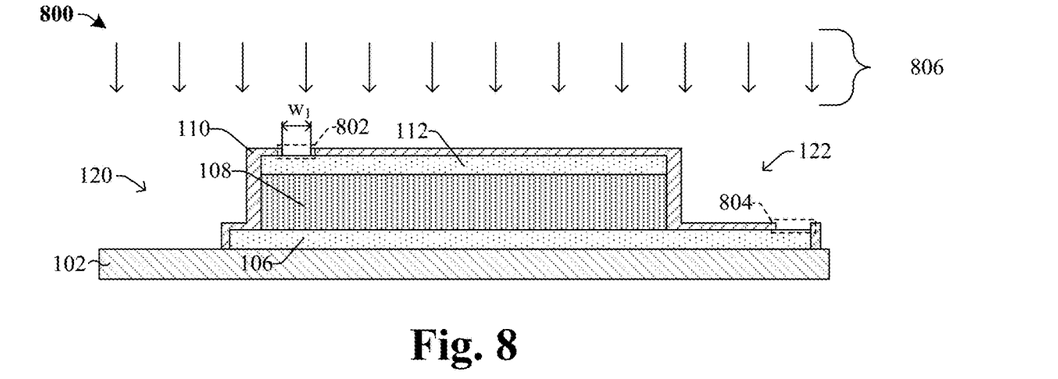

As shown in cross-sectional view 800 of FIG. 8, an etching process is performed to etch portions of the passivation film (702 of FIG. 7) defining a passivation layer 110. The etching process removes a portion of the passivation film (702 of FIG. 7) above a top surface of the substrate 102, leaving the top surface of the substrate 102 exposed. The etching process forms a first opening 802 in the passivation layer 110. The first opening 802 is directly above the top surface of the top electrode 112. Additionally, the etching process forms a second opening 804 in the passivation layer 110. The second opening 804 is directly above a top surface of the bottom electrode 106. In some embodiments, the etching process may be performed by forming a masking layer (not shown) over the passivation film (702 of FIG. 7) and subsequently exposing unmasked areas of the passivation film (702 of FIG. 7) to one or more etchants 806.

The first opening 802 has a width $w_1$. In some embodiments, the width $w_1$ is within a range of 10 μm to 50 μm, 50 μm to 100 μm, 100 μm to 500 μm, 500 μm to 10 mm, or 10 mm to 100 mm. In some embodiments, the thickness of the passivation layer 110 is within a range of 10 Angstroms to 100 Angstroms, 100 Angstroms to 1000 Angstroms, 0.1 μm to 1 μm, 1 μm to 100 μm, or 100 μm to 1 mm.

Figure 9:
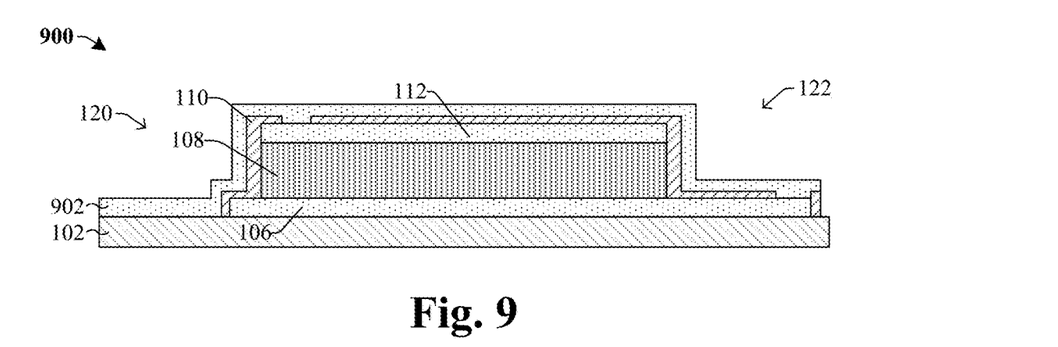

As shown in cross-sectional view 900 of FIG. 9, a metal layer 902 is deposited over the substrate 102, bottom electrode 106, top electrode 112, and the passivation layer 110. The metal layer 902 fills the first opening (802 of FIG. 8) and the second opening (804 of FIG. 8), such that the metal layer 902 directly contacts the top electrode 112 and directly contacts the bottom electrode 106.

Figure 10:
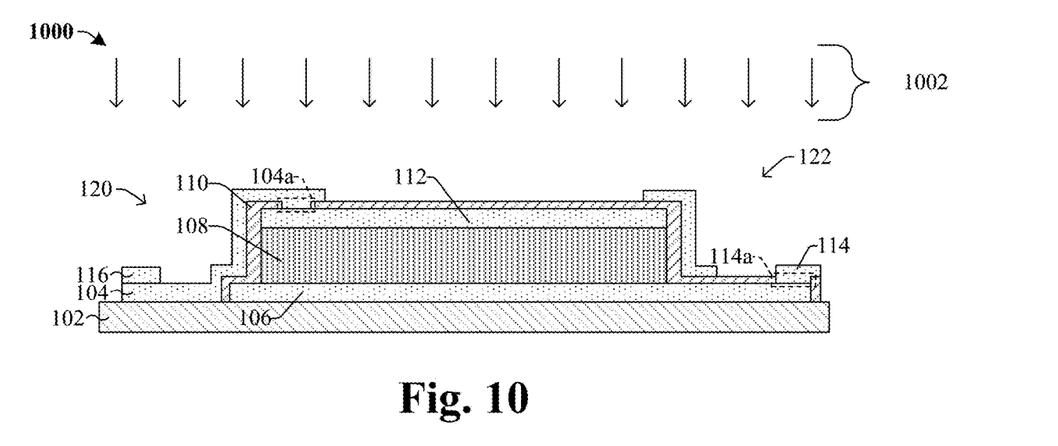

As shown in cross-sectional view 1000 of FIG. 10, an etching process is performed to etch portions of the metal layer (902 of FIG. 9) defining a metal frame 104 and a second electrical lead 114. The second electrical lead 114 is on the second side 122 and has a protrusion 114a that extends through the passivation layer 110 to a top surface of the bottom electrode 106. In some embodiments, the second electrical lead 114 is not formed because electrical contact to the bottom electrode is made from an interconnect structure below the bottom electrode. In some embodiments, the etching process may be performed by forming a masking layer (not shown) over the metal layer (902 of FIG. 9) and subsequently exposing unmasked areas of the metal layer (902 of FIG. 9) to one or more etchants 1002. After performing the etching process, a first electrical lead 116 is deposited over the metal frame 104. The first electrical lead 116 may, for example, be deposited and/or grown by electroless plating, electroplating, or another suitable deposition process.

In some embodiments, the etching process removes a portion of the metal layer (902 of FIG. 9) directly above a top surface of the top electrode 112, leaving a portion of a top surface of the passivation layer 110 exposed. For example, please refer to the top view of FIG. 3B, in which the top surface of the passivation layer 110 is not covered by the metal frame 104. Further, the etching process removes a portion of the metal layer (902 of FIG. 9) on the second side 122 above the top surface of the bottom electrode 106. For example, please refer to the top view of FIG. 3B, in which the portion 110c of the passivation layer 110 is not covered by the metal frame 104. Furthermore, the etching process also removes the metal layer (902 of FIG. 9) from the edges of the device exposing the substrate 102 (see, for example, first and second sections 102a, 102b of substrate 102 of FIG. 3B).

Figure 11:
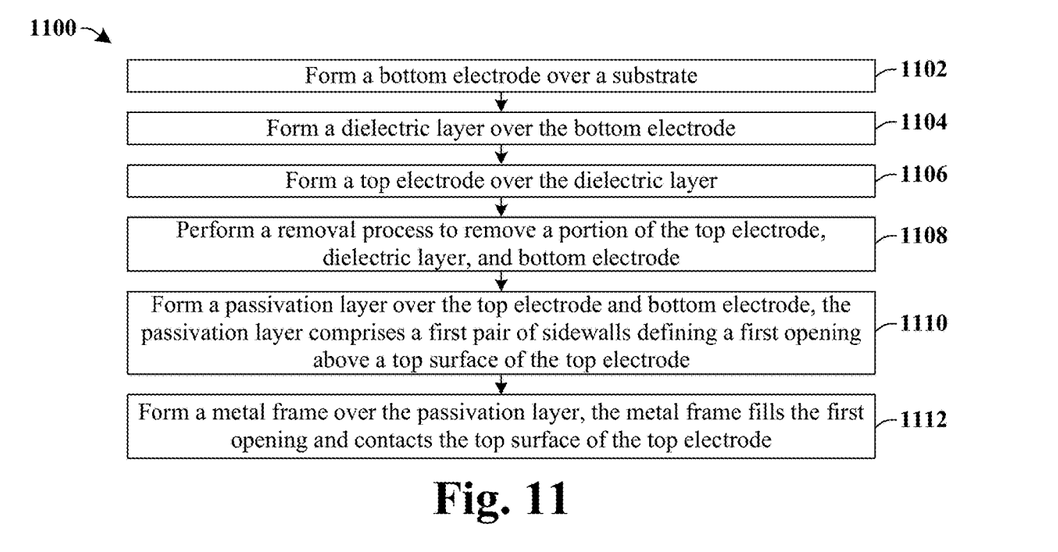
FIG. 11 illustrates a methodology in flowchart format that illustrates some embodiments of a method of forming a MIM capacitor including a passivation layer and metal frame, according to the present disclosure.

FIG. 11 illustrates a method 1100 of forming a MIM capacitor in accordance with some embodiments. Although the method 1100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1102, a bottom electrode is formed over a substrate. FIG. 5 illustrates a cross-sectional view 500 corresponding to some embodiments of act 1102.

At 1104, a dielectric layer is formed over the bottom electrode. FIG. 5 illustrates a cross-sectional view 500 corresponding to some embodiments of act 1104.

At 1106, a top electrode is formed over the dielectric layer. FIG. 5 illustrates a cross-sectional view 500 corresponding to some embodiments of act 1106.

At 1108, a removal process is performed to remove a portion of the top electrode, dielectric layer and bottom electrode. FIG. 6 illustrates a cross-sectional view 600 corresponding to some embodiments of act 1108.

At 1110, a passivation layer is formed over the top electrode and bottom electrode, the passivation layer has a first opening above a top surface of the top electrode. FIGS. 7-8 illustrate cross-sectional views 700 and 800 corresponding to some embodiments of act 1110.

At 1112, a metal frame is formed over the passivation layer, the metal frame fills the first opening and contacts the top surface of the top electrode. FIG. 9 illustrates a cross-sectional view 900 corresponding to some embodiments of act 1112.

Accordingly, in some embodiments, the present disclosure relates to a method of forming a MIM capacitor that includes a passivation layer and metal frame, the metal frame is in direct contact with a top electrode.

In some embodiments, the present disclosure relates to a metal-insulator-metal (MIM) capacitor including a top electrode overlying a substrate; a passivation layer overlying the top electrode, wherein the passivation layer has a step region that continuously contacts and extends from a top surface of the top electrode to sidewalls of the top electrode; and a metal frame overlying the passivation layer, wherein the metal frame continuously contacts and extends from a top surface of the passivation layer to upper sidewalls of the passivation layer in the step region, and wherein the metal frame has a protrusion that extends through the passivation layer and contacts the top surface of the top electrode.

In other embodiments, the present disclosure relates to a metal-insulator-metal (MIM) capacitor including a bottom electrode disposed over a substrate; a dielectric layer disposed over the bottom electrode; a top electrode disposed over the dielectric layer; a passivation layer disposed over the top electrode, wherein the passivation layer continuously extends over a top surface and sidewalls of the top electrode, sidewalls of the dielectric layer, and sidewalls of the bottom electrode; and a metal frame disposed over an upper surface of the passivation layer and along sidewalls of the passivation layer, wherein the metal frame has a protrusion that extends through the passivation layer and contacts a top surface of the top electrode.

In yet other embodiments, the present disclosure relates to a method for forming a metal-insulator-metal (MIM) capacitor. The method including forming a bottom electrode layer over a substrate; forming a dielectric film over the bottom electrode layer; forming a top electrode layer over the dielectric film; performing a removal process to remove a portion of the top electrode layer, dielectric film, and bottom electrode layer to form a top electrode, dielectric layer, and a bottom electrode; forming a passivation layer over the top electrode and bottom electrode, wherein the passivation layer has a first opening above a top surface of the top electrode, and wherein the passivation layer has a second opening above a top surface of the bottom electrode; and forming a metal frame over the passivation layer, wherein the metal frame fills the first opening and contacts the top surface of the top electrode through the first opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-insulator-metal (MIM) capacitor, comprising:
   a top electrode overlying a substrate;
   a passivation layer overlying the top electrode, wherein the passivation layer has a step region that continuously contacts and extends from a top surface of the top electrode to sidewalls of the top electrode; and
   a metal frame overlying the passivation layer, wherein the metal frame continuously directly contacts and extends from a top surface of the passivation layer to upper sidewalls of the passivation layer in the step region, wherein the metal frame has a protrusion that extends through the passivation layer and contacts the top surface of the top electrode, wherein in the step region the metal frame has a slanted straight segment that directly overlies a slanted straight sidewall of the top electrode, and wherein the metal frame is electrically conductive.

2. The MIM capacitor of claim 1, wherein the protrusion is laterally offset the step region by a non-zero distance.

3. The MIM capacitor of claim 1, further comprising:
   a bottom electrode underlying the top electrode;
   a dielectric layer disposed between the top electrode and the bottom electrode; and
   wherein the passivation layer continuously extends along sidewalls of the dielectric layer, and sidewalls of the bottom electrode, wherein the metal frame continuously extends along inner sidewalls of the passivation layer to the top surface and the upper sidewalls of the passivation layer.

4. The MIM capacitor of claim 3, wherein in the step region the passivation layer has a first horizontal segment over a slanted segment and a second horizontal segment under the slanted segment.

5. The MIM capacitor of claim 3, wherein the dielectric layer comprises a first dielectric sidewall and a second dielectric sidewall opposite the first dielectric sidewall, wherein the bottom electrode comprises a first electrode sidewall and a second electrode sidewall opposite the first electrode sidewall, wherein the first and second dielectric sidewalls are laterally between the first and second electrode sidewalls, wherein the first dielectric sidewall is laterally offset the first electrode sidewall by a first distance, and wherein the second dielectric sidewall is laterally offset the second electrode sidewall by a second distance greater than the first distance.

6. The MIM capacitor of claim 5, further comprising:
   an electrical lead overlying the bottom electrode, the electrical lead contacts a top surface of the bottom electrode at a point laterally offset the second dielectric sidewall by a non-zero distance in a direction away from the dielectric layer.

7. The MIM capacitor of claim 6, wherein the electrical lead has a protrusion that extends through the passivation layer and directly contacts the top surface of the bottom electrode.

8. The MIM capacitor of claim 1, wherein the metal frame continuously wraps around and contacts an outer perimeter of the passivation layer from a first point below a bottom surface of the top electrode to a second point above the top surface of the top electrode.

9. A metal-insulator-metal (MIM) capacitor, comprising:
   a bottom electrode disposed over a substrate;
   a dielectric layer disposed over the bottom electrode;
   a top electrode disposed over the dielectric layer;
   a passivation layer disposed over the top electrode, wherein the passivation layer continuously extends over a top surface and sidewalls of the top electrode, sidewalls of the dielectric layer, and sidewalls of the bottom electrode; and
   a metal frame disposed over and directly contacting a top surface of the passivation layer and sidewalls of the passivation layer, wherein the metal frame has a protrusion that extends through the passivation layer and contacts the top surface of the top electrode, wherein the metal frame is discontinuous over a center portion of the top surface of the passivation layer, and wherein the metal frame is electrically conductive.

10. The MIM capacitor of claim 9, wherein the protrusion directly contacts inner sidewalls of the passivation layer and is laterally between the sidewalls of the top electrode.

11. The MIM capacitor of claim 9, wherein outermost sidewalls of the dielectric layer extend past outermost sidewalls of the top electrode in a top view.

12. The MIM capacitor of claim 9, wherein the metal frame continuously extends from inner sidewalls of the passivation layer to the top surface and upper sidewalls of the passivation layer.

13. The MIM capacitor of claim 9, further comprising:
   an electrical contact overlying the passivation layer and the bottom electrode, wherein the electrical contact has a protrusion that extends through the passivation layer and directly contacts a top surface of the bottom electrode.

14. The MIM capacitor of claim 9, wherein the metal frame continuously wraps around an outer perimeter of a bottom surface of the dielectric layer and continuously extends from the outer perimeter of the bottom surface of the dielectric layer to a point above the top surface of the top electrode.

15. A metal-insulator-metal (MIM) capacitor, comprising:
   a bottom electrode overlying a substrate;
   a dielectric layer overlying the bottom electrode;
   a top electrode overlying the dielectric layer, wherein the top electrode comprises a slanted straight sidewall laterally offset from an outer sidewall of the dielectric layer in a direction away from the outer sidewall;
   a passivation layer overlying the top electrode, wherein the passivation layer continuously extends from the outer sidewall of the dielectric layer to the slanted straight sidewall, wherein the passivation layer directly contacts an upper surface of the dielectric layer that extends from the outer sidewall of the dielectric layer to the slanted straight sidewall; and
   a metal frame overlying the passivation layer, wherein the metal frame comprises a first horizontal segment directly overlying the upper surface of the dielectric layer and a second horizontal segment vertically above the first horizontal segment, wherein a slanted vertical segment of the metal frame continuously extends from the first horizontal segment to the second horizontal segment and directly overlies the slanted straight sidewall of the top electrode.

16. The MIM capacitor of claim 15, wherein the slanted straight sidewall of the top electrode and the outer sidewall of the passivation layer are respectively slanted relative to a top surface of the substrate.

17. The MIM capacitor of claim 15, wherein the metal frame comprises a protrusion that extends from the second horizontal segment, along an inner sidewall of the passivation layer, to a top surface of the top electrode.

18. The MIM capacitor of claim 1, wherein the passivation layer continuously vertically extends from the slanted straight segment of the metal frame to the slanted straight sidewall of the top electrode.

19. The MIM capacitor of claim 1, wherein in the step region the metal frame further has a first straight horizontal segment and a second straight horizontal segment vertically below the first straight horizontal segment, wherein the slanted straight segment extends from the first straight horizontal segment to the second straight horizontal segment.

20. The MIM capacitor of claim 9, wherein the metal frame is electrically coupled to the top electrode such that an electrical potential of the metal frame is equal to an electric potential of the top electrode.

* * * * *